United States Patent
Song et al.

(10) Patent No.: US 10,859,631 B2
(45) Date of Patent: Dec. 8, 2020

(54) METHOD AND APPARATUS FOR MEASURING STATE OF BATTERY

(71) Applicant: SAMSUNG ELECTRONICS CO., LTD., Suwon-si (KR)

(72) Inventors: Tae Won Song, Yongin-si (KR); Jinho Kim, Yongin-si (KR); Young Hun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 313 days.

(21) Appl. No.: 15/894,682

(22) Filed: Feb. 12, 2018

(65) Prior Publication Data

US 2019/0128968 A1  May 2, 2019

(30) Foreign Application Priority Data

Oct. 26, 2017  (KR) .................. 10-2017-0140185

(51) Int. Cl.
  *G01R 31/36* (2020.01)
  *G01R 31/367* (2019.01)
  *G01R 31/387* (2019.01)
  *G01R 31/392* (2019.01)
(52) U.S. Cl.
  CPC ......... *G01R 31/367* (2019.01); *G01R 31/387* (2019.01); *G01R 31/392* (2019.01)
(58) Field of Classification Search
  CPC .. G01R 31/367; G01R 31/387; G01R 31/388; G01R 31/392; H01M 10/48
  USPC ................ 702/63; 320/106, 118, 132, 137
  See application file for complete search history.

(56) References Cited

U.S. PATENT DOCUMENTS

| | | | |
|---|---|---|---|
| 7,253,587 B2 * | 8/2007 | Meissner | G01R 31/367 320/132 |
| 7,423,408 B2 * | 9/2008 | Koch | G01R 31/367 320/132 |
| 9,091,735 B2 | 7/2015 | Wang et al. | |
| 9,244,129 B2 | 1/2016 | Sahinoglu et al. | |
| 10,061,366 B2 * | 8/2018 | Badam | G06F 1/3212 |
| 2011/0288797 A1 | 11/2011 | Schmidt | |
| 2016/0190615 A1 | 6/2016 | Longman et al. | |

FOREIGN PATENT DOCUMENTS

| | | |
|---|---|---|
| JP | 2009-48813 A | 3/2009 |
| JP | 2011-70894 A | 4/2011 |
| JP | 4689755 B1 | 5/2011 |
| JP | 5971477 B2 | 8/2016 |
| KR | 10-1160541 B1 | 6/2012 |

* cited by examiner

*Primary Examiner* — John H Le
(74) *Attorney, Agent, or Firm* — NSIP Law

(57) ABSTRACT

Disclosed is a method and apparatus for measuring a battery state. The method includes determining an operational mode of a battery; measuring a battery state of the battery using an electrochemical model in response to the battery determined to be operating in a low rate mode, and measuring the battery state using a modified electrochemical model based on a characteristic of the battery, in response to the battery determined to be operating in a high rate mode.

18 Claims, 6 Drawing Sheets

100

METHOD AND APPARATUS FOR MEASURING STATE OF BATTERY

CROSS-REFERENCE TO RELATED APPLICATIONS

This application claims the benefit under 35 USC § 119(a) of Korean Patent Application No. 10-2017-0140185 filed on Oct. 26, 2017, in the Korean Intellectual Property Office, the entire disclosure of which is incorporated herein by reference for all purposes.

BACKGROUND

1. Field

This Application relates to a method and apparatus for measuring a battery state of a battery.

2. Description of the Background

To stably use a battery to the maximum capacity of the battery, it is important to accurately estimate a current state of the battery. The battery state may include a state of charge (SOC), a state of health (SOH), and the like.

Various methods may be used to estimate a battery state. The various methods may include, for example, a current counting method, a voltage measurement method, and a resistance measurement method.

The current counting method, for example, an Ah counting method or a Coulomb counting method, refers to a method of estimating an SOC by applying a used capacity based on a relationship between a current and a time.

The voltage measurement method refers to a method of estimating a state of a battery based on a relationship between an SOC and an open circuit voltage (OCV) that is measured in advance from an OCV of the battery. For example, the voltage measurement method may calculate the SOC by referring to a lookup table in which the OCV and the SOC are provided to correspond to each other.

The resistance measurement method refers to a method of estimating a state of a battery based on a relationship between an SOC and an internal resistance of the battery. For example, the resistance measurement method may calculate the SOC by referring to a lookup table in which the internal resistance and the SOC are provided to correspond to each other.

The above information disclosed in this Background section is only for enhancement of understanding of the background of the disclosure and therefore it may contain information that does not form any part of the prior art nor what the prior art may suggest to a person of ordinary skill in the art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of measuring a battery state includes determining an operational mode of a battery, measuring a battery state of the battery using an electrochemical model in response to the battery determined to be operating in a low rate mode, and measuring the battery state using a modified electrochemical model based on a characteristic of the battery in response to the battery determined to be operating in a high rate mode.

The battery state may include a state of charge (SOC) of the battery.

The determining may include determining the operational mode based on a current value output from the battery.

The determining of the operational mode based on the current value may include calculating a current rate (C-rate) based on the current value; and determining the operational mode based on the C-rate.

The determining of the operational mode based on the C-rate may include determining that the battery is operating in the high rate mode in response to the C-rate being greater than or equal to a first preset reference value; and determining that the battery is operating in the low rate mode in response to the C-rate being less than the first preset reference value.

The determining of the operational mode based on the C-rate may further include acquiring a voltage value of the battery; and determining that the battery is operating in the high rate mode in response to the C-rate being less than the first preset reference value and the voltage value being greater than or equal to a second preset reference value.

The measuring of the battery state using the electrochemical model may include measuring the battery state using a Butler-Volmer's equation for determining an electrochemical reaction amount on an interface between an electrode and an electrolyte.

The measuring of the battery state using the modified electrochemical model may include measuring the battery state using a modified Butler-Volmer's equation based on the characteristic of the battery.

The characteristic of the battery may include the concentration of the battery.

The concentration of the battery may include the concentration overvoltage of the battery.

The determining may include measuring a temperature of the battery; and determining that the battery is operating in the high rate mode in response to the temperature being less than a third preset reference value.

In another general aspect, an apparatus for measuring a battery state includes a battery, and a controller configured to determine an operational mode of the battery, to measure the battery state using an electrochemical model in response to the battery determined to be operating in a low rate mode, and to measure the battery state using a modified electrochemical model based on concentration of the battery, in response to the battery determined to be operating in a high rate mode.

The battery state may include an SOC of the battery.

The apparatus for measuring a battery state may further include a first sensor configured to measure a current value output from the battery. The controller may be configured to determine the operational mode based on the current value output from the battery.

The controller may be configured to calculate a C-rate based on the current value, and to determine the operational mode based on the C-rate.

The controller may be configured to determine that the battery is operating in the high rate mode in response to the C-rate being greater than or equal to a first preset reference value, and to determine that the battery is operating in the low rate mode in response to the C-rate being less than the first preset reference value.

The sensor may be configured to acquire a voltage value of the battery, and the controller may be configured to determine that the battery is operating in the high rate mode in response to the C-rate being less than the first preset reference value and the voltage value being greater than or equal to a second preset reference value.

The controller may be configured to measure the battery state using a Butler-Volmer's equation for determining an electrochemical reaction amount on an interface between an electrode and an electrolyte in response to the battery operating in the low rate mode.

The controller may be configured to measure the battery state using a modified Butler-Volmer's equation based on the characteristic of the battery in response to the battery operating in the high rate mode.

The characteristic of the battery may include the concentration of the battery.

The concentration of the battery may include the concentration overvoltage of the battery.

The apparatus for measuring a battery state may further include a second sensor configured to measure a temperature of the battery. The controller may be configured to determine that the battery is operating in the high rate mode in response to the temperature being less than a third preset reference value.

Other features and aspects will be apparent from the following detailed description, the drawings, and the claims.

BRIEF DESCRIPTION OF THE DRAWINGS

Throughout the drawings and the detailed description, the same drawing reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms of "first" or "second" are used to explain various components, the components are not limited to the terms. These terms should be used only to distinguish one component from another component. For example, a "first" component may be referred to as a "second" component, or likewise, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. It should be further understood that the terms "comprises/includes" and/or "comprising/including," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

Figure 1:
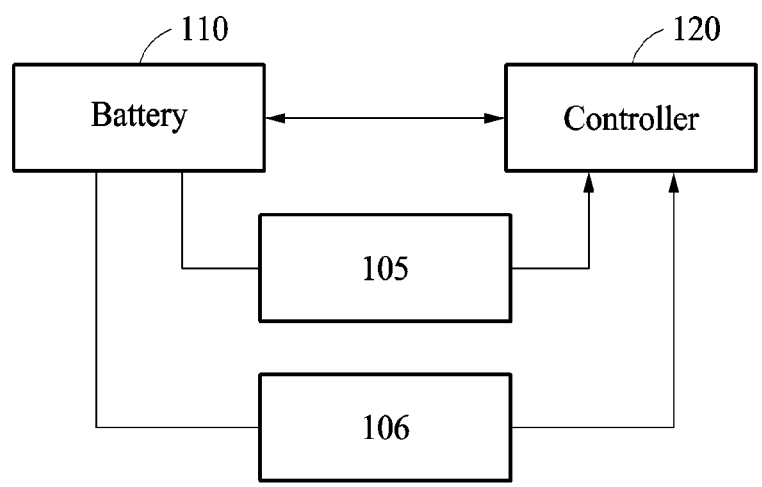
FIG. 1 illustrates a first example of a battery state measurement apparatus.

FIG. 1 illustrates a first example of a battery state measurement apparatus.

Referring to FIG. 1, a battery state measurement apparatus 100 measures a battery state of a battery 110. Here, the battery state includes, for example, a state of charge (SOC), a state of health (SOH), and the like.

The battery state measurement apparatus 100 may be configured in any type of device using electric energy. For example, the battery state measurement apparatus 100 may be provided in an energy storage system (ESS), an electronic device, a transportation device, and the like. The battery 110 of the battery state measurement apparatus 100 may function as a power source for elements that constitute the electronic device, the transportation device, and the like.

In an example in which the battery state measurement apparatus 100 is provided in the transportation device, for example, a vehicle, the battery state measurement apparatus 100 may be provided in, for example, a smart mobility, an electric vehicle, a hybrid vehicle, and a plug-in hybrid vehicle.

The battery 110 includes one or more battery cells. For example, the battery cell may indicate a secondary cell. The battery 110 may include the battery cell, a battery module, or a battery pack. The battery pack may include one or more battery modules. The battery module may include one or more battery cells.

The controller 120 measures a battery state of the battery 110.

When the battery 110 is configured as the battery pack or the battery module, the controller 120 is understood as a battery management system (BMS). That is, the controller 120 may include a master BMS (M-BMS) and one or more slave BMSs (S-BMSs).

When the battery 110 is configured as the battery pack, one or more S-BMSs measure a battery state of one or more battery modules. That is, the one or more S-BMSs may be connected to the one or more battery modules, respectively. The one or more S-BMSs transmit the measured battery state to the M-BMS.

The M-BMS measures a battery state of the battery pack based on the battery state received from the one or more S-BMSs. That is, the M-BMS may measure a battery state of the battery module and the battery state of the battery pack.

The same principle is applicable to an example in which the battery 110 is configured as the battery module. One or more S-BMSs measure a battery state of one or more battery cells. That is, the one or more S-BMSs may be connected to the one or more battery cells, respectively. The one or more S-BMSs transmit the measured battery state to the M-BMS.

The M-BMS measures a battery state of the battery module based on the battery state received from the one or more S-BMSs. That is, the M-BMS measures a battery state of the battery cell and the battery state of the battery module.

The controller 120 measures the battery state of the battery 110 based on an electrochemical model of the battery 110. The electrochemical model may be a method of calculating internal concentration and potential information of the battery 110 based on physical characteristics of the battery 110 and estimating a residual charge amount of the battery 110. The controller 120 measures the battery state based on the electrochemical model and may provide internal state information, for example, concentration, potential, and current density, of the battery 110. The controller 120 may minimize degradation of the battery 110 using an available output predicting function, a fast charging function, and a fast discharging function, etc., of the battery 110.

The controller 120 determines an operational mode of the battery 110 and measures the battery state based on a result of the determination.

The battery 110 may operate in a low rate mode or a high rate mode. The battery 110 operates in the low rate mode when the battery 110 performs a general operation, such as charging, discharging, etc. The battery 110 operates in the high rate mode when the battery 110 performs an operation such as fast charging, fast discharging, etc.

The operational mode of the battery 110 is classified into the high rate mode or the low rate mode based on an output current value. Accordingly, the controller 120 determines the operational mode of the battery 110 based on the current value output from the battery 110.

The battery state measurement apparatus 100 further includes a first sensor 105. The first sensor 105 measures a current value output from the battery 110 or a voltage value of the battery 110. For example, the voltage value of the battery 110 indicates an open circuit voltage (OCV). The first sensor 105 outputs the measured current value or voltage value to the controller 120.

The controller 120 calculates a current rate (C-rate) of the battery 110 based on the current value output from the battery 110. The C-rate refers to a value acquired by dividing charging current or discharging current of the battery 110 by a rated capacity value of the battery 110. For example, when a battery cell having the rated capacity value of 10 Ah discharges the current of 10 A, the C-rate is 1 C. When the battery cell discharges the current of 20 A, the C-rate is 2 C. Based on the same principle, when a battery cell having the rated capacity value of 100 Ah discharges the current of 100 A, the C-rate is 1 C. When the battery cell discharges the current of 200 A, the C-rate is 2 C.

The controller 120 determines an operational mode of the battery 110 based on the C-rate. When the C-rate is greater than or equal to a first reference value, the controller 120 determines that the battery 110 is operating in the high rate mode. When the C-rate is less than the first reference value, the controller 120 determines that the battery 110 is operating in the low rate mode. For example, the first reference value may be 2 C. The first reference value may be preset based on a number of battery cells or a number of battery modules.

When the C-rate is less than the first reference value and the voltage value is greater than or equal to a second reference value, the controller 120 determines that the battery 110 is operating in the high rate mode. The second reference value may be a value preset by a user. The user may set the second reference value based on an accuracy of the battery state measurement apparatus 100.

When a difference between an actual voltage value and the voltage value measured by the first sensor 105 is greater than or equal to the second reference value, the controller 120 determines that the battery 110 is operating in the high rate mode.

When the battery 110 operates in the low rate mode, the controller 120 measures the battery state using the electrochemical model of the battery 110. The electrochemical model may include a Butler-Volmer's equation. The controller 120 may enhance the accuracy of the determination of the battery state using a charge conservation law and a mass conservation law. For example, the controller 120 enhances the accuracy of the determination of the battery state using a Butler-Volmer's equation for determining an electrochemical reaction amount on an interface between an electrode and an electrolyte.

Hereinafter, an operation of the controller 120 that measures the battery state using the Butler-Volmer's equation will be described with reference to the following equations. Equation 1 may be used to calculate an activation overvoltage $\eta_i$ of the battery 110. The activation overvoltage $\eta_i$ of Equation 1 may be equal to an activation overvoltage $\eta_{ct}$ of FIG. 3B. An equilibrium potential $U_{i,ref}$ of Equation 1 may be equal to an equilibrium potential $U_{eq}$ of FIG. 3B.

$$\eta_i = \varphi_s - \varphi_e - U_{i,ref} - \frac{j^{Li}}{a_{s,i}} R_{f,i}, \; i = n, p \tag{1}$$

In Equation 1, $\eta_i$ denotes an activation overvoltage [V], $\varphi_s$ denotes a solid potential (or electrode potential) [V], $\varphi_e$ denotes an electrolyte potential [V], $U_{i,ref}$ denotes an equilibrium potential [V], $j^{Li}$ denotes a current density [A/m$^3$], $a_{s,i}$ denotes a specific surface area [1/m] representing a surface area over volume of an electrode active material, $R_{f,i}$ denotes a film resistance [$\Omega \cdot m^2$], and i denotes a reaction in an anode or a negative electrode (n) or a reaction in a cathode or a positive electrode (p). That is, Equation 1 may indicate the reaction in the anode or the reaction in the cathode depending on whether i is n or p. The electrode active material generates electric energy through a chemical reaction in response to charging or discharging of the battery 110.

An exchange current density of the battery 110 may be calculated according to Equation 2.

$$i_{0,i} = k_i (c_{s,i}^{max} - c_{s,i})^{\alpha_{a,i}} c_{s,i}^{\alpha_{a,i}}, i = n, p \quad (2)$$

In Equation 2, $i_{0,i}$ denotes an exchange current density [A/m²], $k_i$ denotes a reaction constant, $c_{s,i}$ denotes a surface concentration [mol/m³], $c_{s,i}^{max}$ denotes a maximum surface concentration [mol/m³], $\alpha_{a,i}$ denotes a charge transfer coefficient in the anode, $\alpha_{c,i}$ denotes a charge transfer coefficient in the cathode, $c_{e,i}$ denotes an electrolyte concentration [mol/m³], and i denotes a reaction in the anode (n) or a reaction in the cathode (p). That is, Equation 2 may indicate the reaction in the anode or the reaction in the cathode depending on whether i is n or p.

The controller 120 is configured to replace Equation 1 and Equation 2 for the Butler-Volmer's equation. The Butler-Volmer's equation is represented as shown in Equation 3.

$$j^{Li} = a_{s,i} i_{0,i} \left[ \exp\left(\frac{\alpha_{a,i} F}{RT} \eta_i\right) - \exp\left(-\frac{\alpha_{c,i} F}{RT} \eta_i\right) \right], i = n, p \quad (3)$$

In Equation 3, $j^{Li}$ denotes a current density [A/m³], $\alpha_{s,i}$ denotes a specific surface area [1/m] representing a surface area over volume of an electrode active material, $i_{0,i}$ denotes an exchange current density [A/m²], $\alpha_{a,i}$ denotes a charge transfer coefficient in the anode, F denotes Faraday's constant [C/mol], R denotes a universal gas constant [J/(mol·K)], T denotes a temperature [K], $\eta_i$ denotes an activation overvoltage [V], $\alpha_{c,i}$ denotes a charge transfer coefficient in the cathode, and i denotes the reaction in the anode (n) or the reaction in the cathode (p). That is, Equation 3 indicates the reaction in the anode or the reaction in the cathode depending on whether i is n or p.

The controller 120 calculates the current density $j^{Li}$ from Equation 1 to Equation 3 using a Newton-Raphson method.

The controller 120 calculates the solid potential $\varphi_s$ and the electrolyte potential $\varphi_e$ using the charge conservation law.

The controller 120 calculates the surface concentration $c_{s,i}$ and the electrolyte concentration $c_{e,i}$ using the mass conservation law.

The controller 120 measures the battery state based on the current density $j^{Li}$, the solid potential $\varphi_s$, the electrolyte potential $\varphi_e$, the surface concentration $c_{s,i}$ and the electrolyte concentration $c_{e,i}$.

When the battery 110 operates in the high rate mode, the controller 120 measures the battery state using a modified electrochemical model based on the concentration of the battery 110. For example, the concentration of the battery refers to the concentration overvoltage. The modified electrochemical model includes a modified Butler-Volmer's equation based on the concentration of the battery 110. The controller 120 enhances the accuracy of the determination of the battery state using the charge conservation law and the mass conservation law.

Hereinafter, an operation of the controller 120 that measures the battery state using the modified Butler-Volmer's equation will be described with reference to the following equations. Equation 4 is used to calculate an overvoltage of the battery 110. The overvoltage of Equation 4 includes an activation overvoltage $\eta_i$ and a concentration overvoltage $\eta_{conc,i}$. The concentration overvoltage of Equation 4 may be equal to a concentration overvoltage $\eta_c$ of FIG. 4B.

$$\eta_i + \eta_{conc,i} = \varphi_s - \varphi_e - U_{i,ref} - \frac{j^{Li}}{a_{s,i}} R_{f,i}, i = n, p \quad (4)$$

In Equation 4, $\eta_i$ denotes an activation overvoltage [V], $\eta_{conc,i}$ denotes a concentration overvoltage [V], $\varphi_s$ denotes a solid potential [V], $\varphi_e$ denotes an electrolyte potential [V], $U_{i,ref}$ denotes an equilibrium potential [V], $j^{Li}$ denotes a current density [A/m³], $\alpha_{s,i}$ denotes a specific surface area [1/m] representing a surface area over volume of an electrode active material, $R_{f,i}$ denotes a film resistance [Ω·m²], and i denotes a reaction in the anode (n) or a reaction in the cathode (p). That is, Equation 4 indicates the reaction in the anode or the reaction in the cathode depending on whether i is n or p.

The concentration overvoltage may be calculated according to Equation 5.

$$\eta_{conc,i} = -\frac{RT}{\alpha F} \ln\left(1 - \frac{j^{Li}}{j_{lim}^{Li}}\right), i = n, p \quad (5)$$

In Equation 5, $\eta_{conc,i}$ denotes a concentration overvoltage [V], R denotes a universal gas constant [J/(mol·K)], T denotes a temperature [K], α denotes a charge transfer coefficient, F denotes a Faraday's constant [C/mol], $j^{Li}$ denotes a current density [A/m³], $j_{lim}^{Li}$ denotes a limit current density [A/m³], and i denotes a reaction in the anode (n) or a reaction in the cathode (p). That is, Equation 5 indicates the reaction in the anode or the reaction in the cathode depending on whether i is n or p. The charge transfer coefficient α may be equal to the charge transfer coefficient $\alpha_{a,i}$ or $\alpha_{c,i}$ of Equation 3.

The controller 120 may replace Equation 2, Equation 4, and Equation 5 for the modified Butler-Volmer's equation based on the concentration overvoltage of the battery 110. The modified Butler-Volmer's equation may be represented as shown in Equation 6.

$$j^{Li} = a_{s,i} i_{0,i} \left[ \exp\left(\frac{\alpha_{a,i} F}{RT}\left(\varphi_s - \varphi_e - U_{i,ref} - \frac{j^{Li}}{a_{s,i}} R_{f,i} - \eta_{conc,i}\right)\right) - \right.$$
$$\left. \exp\left(-\frac{\alpha_{c,i} F}{RT}\left(\varphi_s - \varphi_e - U_{i,ref} - \frac{j^{Li}}{a_{s,i}} R_{f,i} - \eta_{conc,i}\right)\right) \right], i = n, p \quad (6)$$

In Equation 6, $j^{Li}$ denotes a current density [A/m³], $\alpha_{s,i}$ denotes a specific surface area [1/m] representing a surface area over volume of an electrode active material, $i_{0,i}$ denotes an exchange current density [A/m²], $\alpha_{a,i}$ denotes a charge transfer coefficient in the anode, F denotes a Faraday's constant [C/mol], R denotes a universal gas constant [J/(mol·K)], T denotes a temperature [K], $\varphi_s$ denotes a solid potential [V], $\varphi_e$ denotes an electrolyte potential [V], $U_{i,ref}$ denotes an equilibrium potential [V], $R^{f,i}$ denotes a film resistance [Ω·m²], $\eta_{conc,i}$ denotes a concentration overvoltage [V], $\alpha_{c,i}$ denotes a charge transfer coefficient in the cathode, and i denotes a reaction in the anode (n) or a reaction in the cathode (p). That is, Equation 6 indicates the reaction in the anode or the reaction in the cathode depending on whether i is n or p.

The controller 120 calculates the current density $j^{Li}$ from Equation 2, Equation 4, Equation 5, and Equation 6 using the Newton-Raphson method.

The controller 120 calculates the solid potential $\varphi_s$ and the electrolyte potential $\varphi_e$ using the charge conservation law.

The controller 120 calculates the surface concentration $c_{s,i}$ and the electrolyte concentration $c_{e,i}$ using the mass conservation law.

The controller 120 measures the battery state based on the current density $j^{Li}$, the solid potential $\varphi_s$, the electrolyte potential $\varphi_e$, the surface concentration $c_{s,i}$, and the electrolyte concentration $c_{e,i}$.

In a low temperature state, the battery 110 may operate in the same manner as in the high rate mode. The battery state measurement apparatus 100 may further include a second sensor 106. The second sensor 106 measures a temperature of the battery 110. The second sensor 106 outputs the measured temperature to the controller 120.

When the temperature of the battery 110 is less than a third reference value, the controller 120 determines that the battery 110 is operating in the high rate mode. Here, regardless of whether the battery 110 actually operates in the high rate mode, an operation of the battery 110 may be the same as one in the high rate mode. The third reference value may be a value preset by the user. The user may set the third reference value based on the accuracy of the battery state measurement apparatus 100.

Although FIG. 1 illustrates the battery 110 included in the battery state measurement apparatus 100, this is provided as an example only. The battery 110 may be provided outside the battery state measurement apparatus 100. That is, in an alternative example, the battery state measurement apparatus 100 may not include the battery 110.

Figure 2:
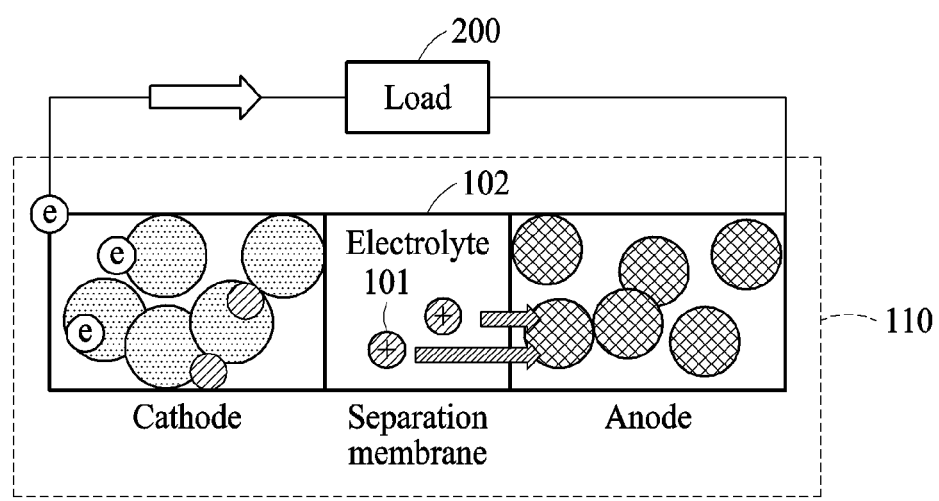
FIG. 2 illustrates an example of a configuration of a battery of FIG. 1.
Figure 3A:
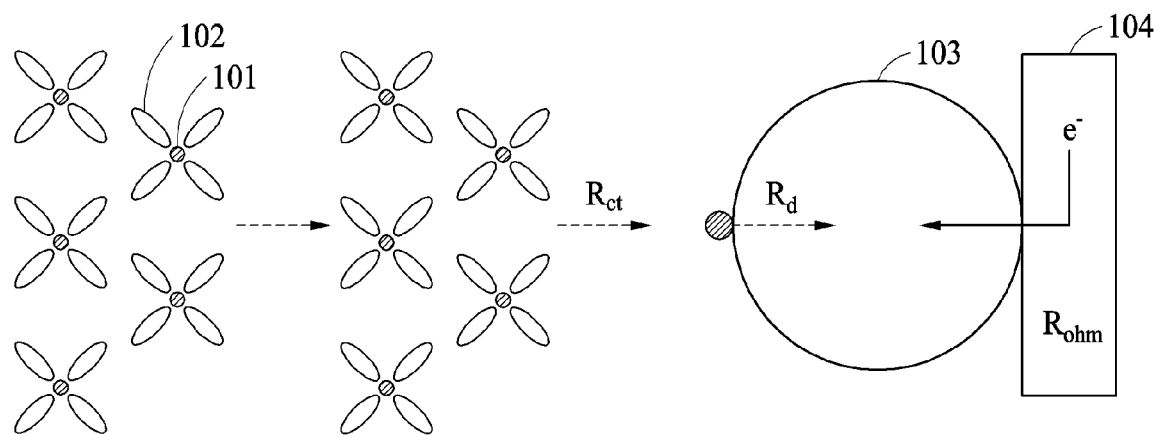
FIG. 3A illustrates an example of a low rate mode of a battery.
Figure 3B:
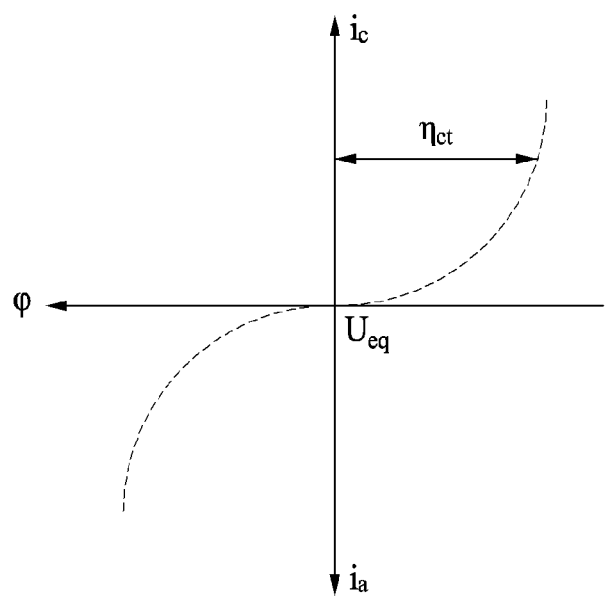
FIG. 3B illustrates an example of a graph showing a low rate mode of a battery.
Figure 4A:
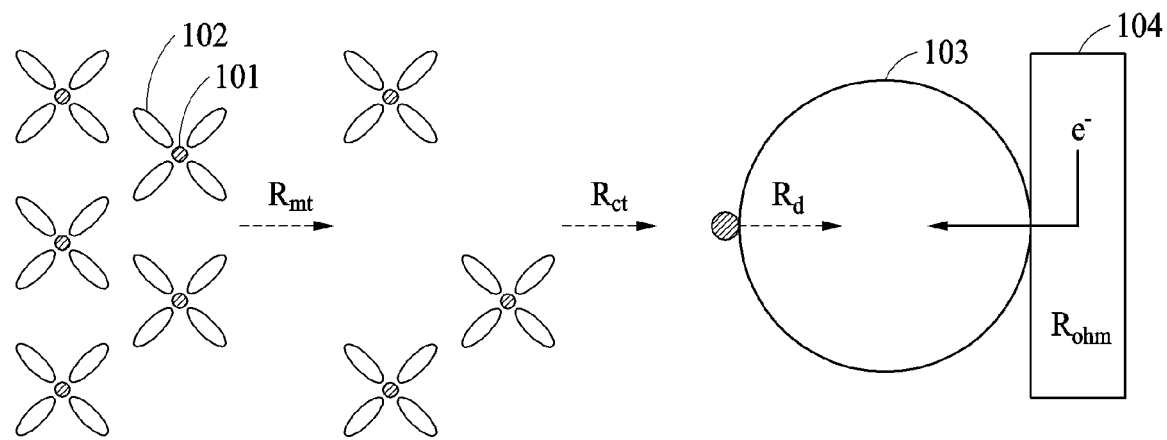
FIG. 4A illustrates an example of a high rate mode of a battery.
Figure 4B:
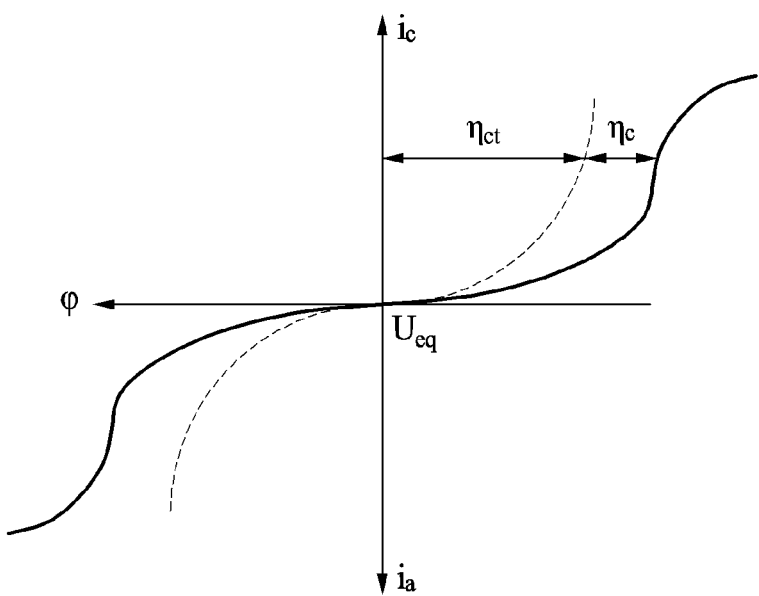
FIG. 4B illustrates an example of a graph showing a high rate mode of a battery.

FIG. 2 illustrates an example of a configuration of a battery of FIG. 1, FIG. 3A illustrates an example of a low rate mode of a battery, FIG. 3B illustrates an example of a graph showing a low rate mode of a battery, FIG. 4A illustrates an example of a high rate mode of a battery, and FIG. 4B illustrates an example of a graph showing a high rate mode of a battery.

Referring to FIG. 2 through FIG. 4B, the battery 110 includes an anode, a cathode, and an electrolyte. The battery 110 supplies power to a load 200 through an electrochemical reaction.

In an example in which the battery 110 is configured as a lithium (Li) ion battery, a Li atom is separated into a Li ion (Li+) 101 and an electron e− through an oxidation reaction in the cathode of the battery 110. The Li ion 101 may be transferred to the anode through a solvent molecule 102 of the electrolyte. The Li ion 101 may become the Li atom through a reduction reaction with the electron e− in the anode. For example, the Li ion 101 may cause the reduction reaction with the electron e− having transferred through a current collector 104 in an electrode active material 103. That is, the battery 110 may output current through the oxidation reduction reaction.

FIGS. 3A and 3B show examples of a reaction of the battery 110 in a low rate mode. In the low rate mode, the Li ion 101 is transferred from the electrolyte through the solvent molecule 102. Here, the Li ion 101 may experience a mass transfer resistance $R_{mt}$ in the electrolyte. The Li ion 101 may experience a charge transfer resistance $R_{ct}$ for causing the reduction reaction with the electron on a surface of the electrode active material 103, that is, an interface between the electrolyte and the electrode. Also, the Li ion 101 may experience a diffusion resistance $R_d$ with respect to transfer of the Li ion 101 within the active material.

Referring to FIG. 3B, it is possible to verify reduction current or cathodic current $i_c$ and oxidation current or anodic current $i_s$ corresponding to a potential difference, that is, a difference between an electric potential $\varphi$ and an equilibrium potential $U_{eq}$. The potential difference may be a value based on an activation overvoltage, for example, overpotential or an activation polarization ($\eta_{ct}$). An origin ($U_{eq}$) denotes the equilibrium potential or an open circuit potential (OCP). If the same charge transfer coefficient $\alpha$ is given, that is, if $\alpha_{a,i} = \alpha_{c,i}$, the graph of FIG. 3B is an origin symmetry. That is, the oxidation reaction and the reduction reaction in the battery 110 have opposite signs and have the same magnitude.

FIGS. 4A and 4B show examples of a reaction of the battery 110 in a high rate mode. In the high rate mode, the Li ion 101 is transferred from the electrolyte through the solvent molecule 102. Here, the Li ion 101 may experience a mass transfer resistance $R_{mt}$ and a charge transfer resistance $R_{ct}$ in the electrolyte. The Li ion 101 may experience the charge transfer resistance $R_{ct}$ for causing the reduction reaction with the electron on the surface of the electrode active material 103, that is, the interface between the electrolyte and the electrode. Also, the Li ion 101 may experience a diffusion resistance $R_d$ with respect to transfer of the Li ion 101 within the active material.

Referring to FIG. 4B, it is possible to verify the reduction current $i_s$ corresponding to the potential $\varphi$ and the oxidation current $i_s$ corresponding to the potential difference. The potential difference may be a value based on the activation overvoltage ($\eta_{ct}$) and the concentration overvoltage, for example, the concentration overpotential or the concentration polarization ($\eta_c$). The origin ($U_{eq}$) denotes the equilibrium potential. If the same charge transfer coefficient $\alpha$ is given, that is, if $\alpha_{a,i} = \alpha_{c,i}$, the graph of FIG. 4B is an origin symmetry. That is, the oxidation reaction and the reduction reaction in the battery 110 have opposite signs and have the same magnitude.

Compared to a case in which the battery 110 operates in the low rate mode, when the battery 110 operates in the high rate mode, the Li ion 101 experiences a relatively greater resistance. Thus, the concentration of the electrolyte may vary and the concentration overvoltage may occur. Accordingly, the controller 120 may measure the battery state of the battery 110 based on the concentration overvoltage.

Although FIGS. 3A through 4B are described by using the reduction reaction in the anode as an example for clarity of description, it is provided as an example only. The similar principle may be applied to the oxidation reaction.

Figure 5:
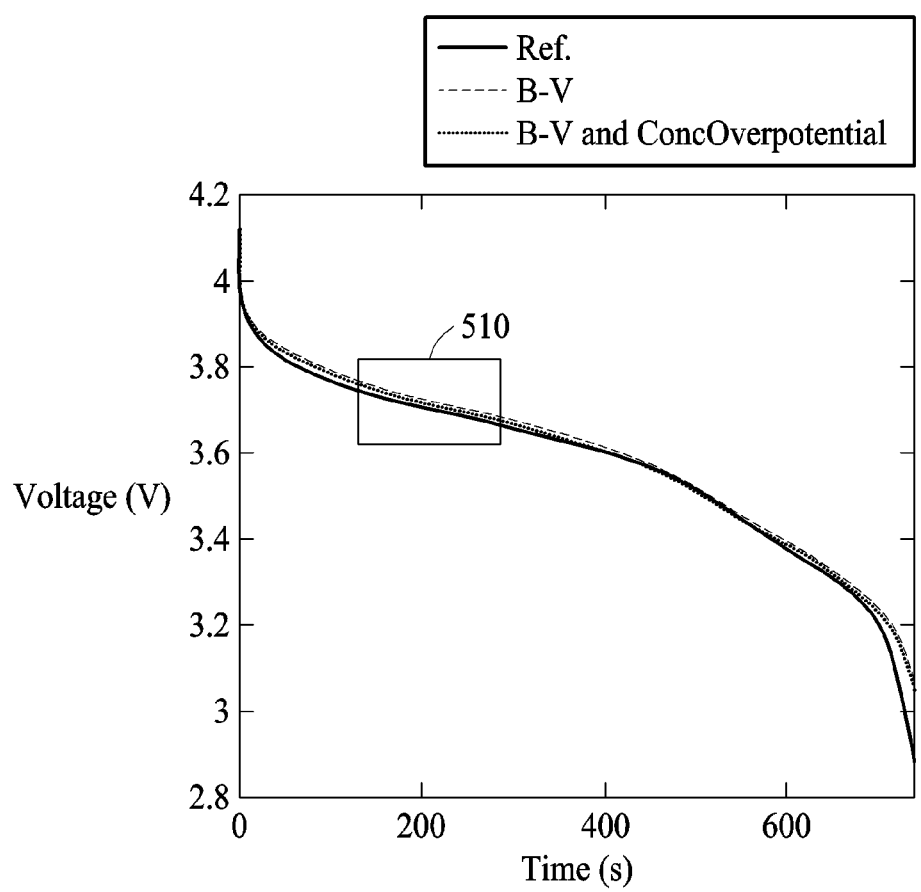
FIG. 5 illustrates an example of a graph describing performance of a battery state measurement apparatus.
Figure 6:
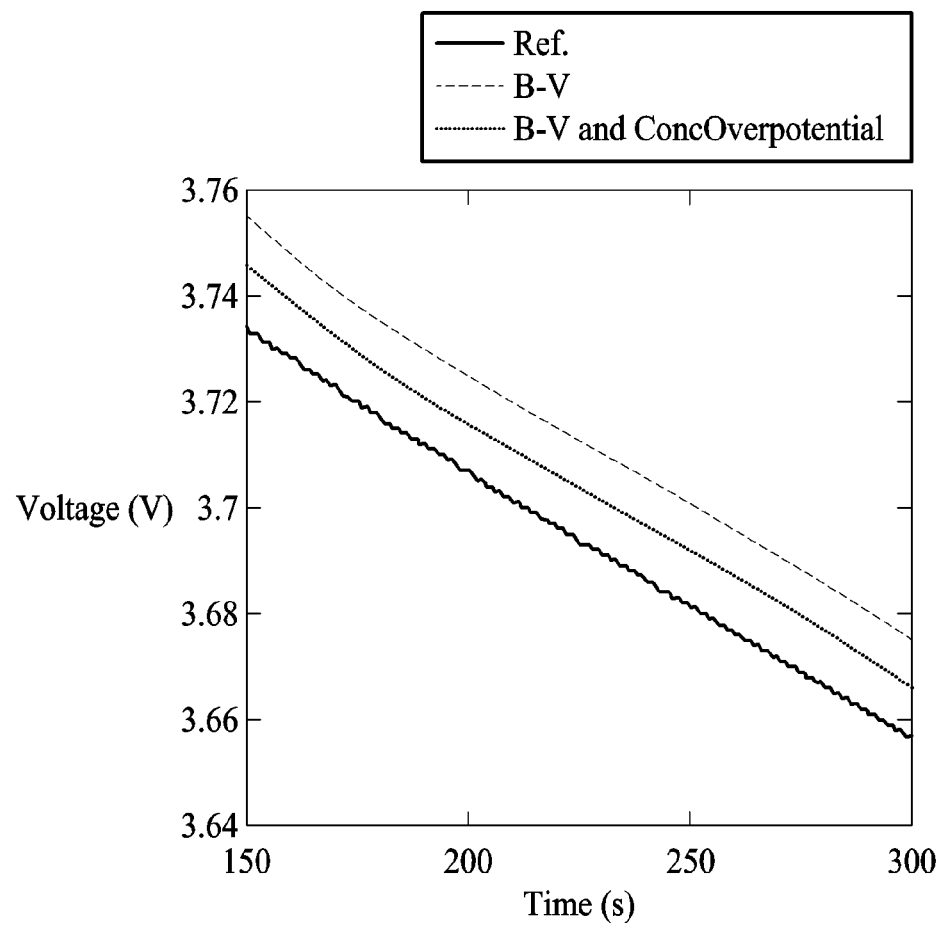
FIG. 6 illustrates an example of an enlarged partial section of the graph of FIG. 5.

FIG. 5 illustrates an example of a graph describing performance of a battery state measurement apparatus, and FIG. 6 illustrates an example of an enlarged partial section of the graph of FIG. 5.

Referring to FIG. 5, it is possible to compare a discharge characteristic curve (B-V and ConcOverpotential) measured by the battery state measurement apparatus 100 using a modified Butler-Volmer's equation based on concentration of the battery 110, a discharge characteristic curve (B-V) measured using a comparative Butler-Volmer's equation, and an actual charging state (Ref.). Here, the battery 110 performs discharging in a high rate mode in which a rated capacity value is 60 Ah, an equilibrium potential is 4V, and a C-rate is 5 C.

An enlarged area 510 of FIG. 5 is shown in FIG. 6. That is, compared to the comparative example, the discharge voltage measured by the battery state measurement apparatus 100 shows a voltage drop of about 10 mV, which is relatively close to the actual charging state.

Figure 7:
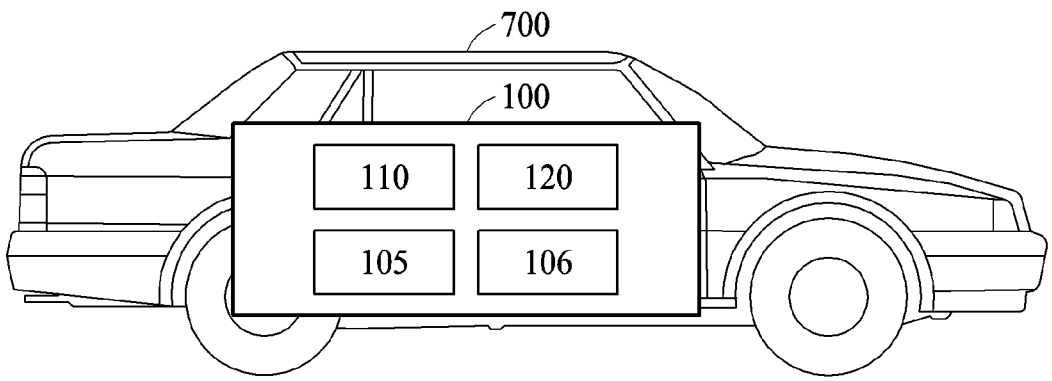
FIG. 7 illustrates a second example of a battery state measurement apparatus.

FIG. 7 illustrates a second example of a battery state measurement apparatus.

FIG. 7 illustrates a vehicle 700. The vehicle 700 may be, for example, an electric vehicle, a hybrid vehicle, or a plug-in hybrid vehicle.

The battery state measurement apparatus 100 includes the battery 110 and the controller 120.

The battery 110 includes one or more battery cells. For example, the battery 110 may indicate a battery cell, a battery module, or a battery pack.

When the battery 110 is configured as the battery pack or the battery module, the controller 120 may be understood as a BMS. That is, the controller 120 may include an M-BMS and one or more S-BMSs. The SBMSs may perform the same operation on a respective battery module or battery cell.

When the battery 110 is configured as the battery module, the S-BMS may collect physical quantity information of battery cells included in the battery 110. The physical quantity information may include any one or any combination of, for example, voltage information, current information, temperature information, and impedance information. The S-BMS transmits the collected physical quantity information to the M-BMS. For example, the S-BMS transmits, to the M-BMS, the collected physical quantity information through a controller area network (CAN) communication, a wireless communication, and the like.

The M-BMS may determine a battery state of the battery cell, the battery module, and/or the battery pack based on the collected physical quantity information. The battery state may include, for example, an SOC or an SOH.

The M-BMS may receive a request for output information from a power management system, for example, an electronic control unit (ECU), within the vehicle 700. The requested output information may include information, for example, a power command value, associated with power calculated by the power management system in response to a user starting an accelerator of the vehicle 700. The M-BMS may determine outputtable power information of the battery pack based on state information, for example, an SOC and/or an SOH, of the battery pack.

The description made above with reference to FIGS. 1 through 6 may be applicable to the example of FIG. 7 and thus, a further description is omitted.

Figure 8:
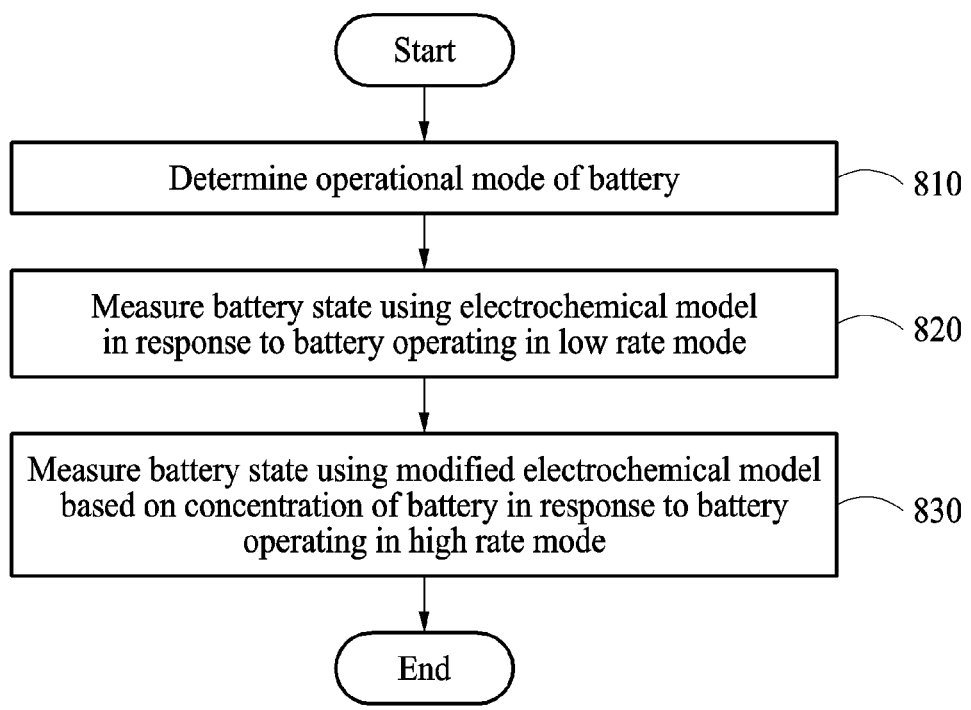
FIG. 8 is a flowchart illustrating an example of a method of measuring a state of a battery.

FIG. 8 is a flowchart illustrating an example of a battery state measurement method.

Referring to FIG. 8, in operation 810, the battery state measurement apparatus 100 determines an operational mode of the battery 110. The operational mode of the battery 110 includes a high rate mode and a low rate mode. For example, the battery 110 may perform a general operation, such as charging, discharging, vehicle cruising, etc., in the low rate mode. The battery 110 may perform an operation, such as fast charging, fast discharging, sudden vehicle acceleration, etc., in a high rate mode.

The battery state measurement apparatus 100 determines the operational mode based on a current value output from the battery 110 or a voltage value of the battery 110. The battery state measurement apparatus 100 calculates a C-rate based on the current value.

The battery state measurement apparatus 100 determines the operational mode based on the C-rate. For example, when the C-rate is greater than or equal to a first reference value, the battery state measurement apparatus 100 may determine that the battery 110 is operating in the high rate mode. When the C-rate is less than the first reference value, the battery state measurement apparatus 100 may determine that the battery 110 is operating in the low rate mode.

When the C-rate is less than the first reference value and the voltage value or a difference between a measured voltage value and an actual voltage value is greater than or equal to a second reference value, the battery state measurement apparatus 100 determines that the battery 110 is operating in the high rate mode. Here, each of the first reference value and the second reference value may be a value preset by the user based on accuracy of the battery state measurement apparatus 100.

When the battery 110 operates in a low temperature, an operation of the battery 110 may be the same as one in the high rate mode. Accordingly, when a temperature of the battery 110 is less than a third reference value, the battery state measurement apparatus 100 determines that the battery 110 is operating in the high rate mode. Here, the third reference value may be a value preset by the user based on the accuracy of the battery state measurement apparatus 100.

In operation 820, the battery state measurement apparatus 100 measures the battery state using an electrochemical model in response to the battery 110 operating in the low rate mode. The electrochemical model includes a Butler-Volmer's equation. The battery state includes an SOC and/or an SOH.

In operation 830, the battery state measurement apparatus 100 measures the battery state using a modified electrochemical model based on concentration of the battery 110 in response to the battery 110 operating in the high rate mode. The modified electrochemical model includes a modified Butler-Volmer's equation based on the concentration of the battery 110.

The battery state measurement apparatus 100 described in FIGS. 1 and 7, and other apparatuses, units, modules, devices, and other components described herein are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2-6 and 8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of measuring a battery state, comprising:
    determining an operational mode of a battery;
    measuring a battery state of the battery using an electrochemical model in response to the battery determined to be operating in a low rate mode; and
    measuring the battery state using a modified electrochemical model based on a characteristic of the battery, in response to the battery determined to be operating in a high rate mode,
    wherein the determining comprises:
    calculating a current rate (C-rate) based on a current value output from the battery; and
    determining the operational mode based on the C-rate.

2. The method of claim 1, wherein the battery state comprises a state of charge (SOC) of the battery.

3. The method of claim 1, wherein the determining of the operational mode based on the C-rate comprises:
    determining that the battery is operating in the high rate mode in response to the C-rate being greater than or equal to a first preset reference value; and
    determining that the battery is operating in the low rate mode in response to the C-rate being less than the first preset reference value.

4. The method of claim 1, wherein the determining of the operational mode based on the C-rate further comprises:
    acquiring a voltage value of the battery; and
    determining that the battery is operating in the high rate mode in response to the C-rate being less than the first preset reference value and the voltage value being greater than or equal to a second preset reference value.

5. The method of claim 1, wherein the measuring of the battery state using the electrochemical model comprises measuring the battery state using a Butler-Volmer's equation for determining an electrochemical reaction amount on an interface between an electrode and an electrolyte.

6. The method of claim 1, wherein the measuring of the battery state using the modified electrochemical model comprises measuring the battery state using a modified Butler-Volmer's equation based on the characteristic of the battery.

7. The method of claim 6, wherein the characteristic of the battery comprises the concentration of the battery.

8. The method of claim 7, wherein the concentration of the battery comprises the concentration overvoltage of the battery.

9. A method of measuring a battery state, comprising:
determining an operational mode of a battery;
measuring a battery state of the battery using an electrochemical model in response to the battery determined to be operating in a low rate mode; and
measuring the battery state using a modified electrochemical model based on a characteristic of the battery, in response to the battery determined to be operating in a high rate mode,
wherein the determining comprises:
measuring a temperature of the battery; and
determining that the battery is operating in the high rate mode in response to the temperature being less than a third preset reference value.

10. An apparatus for measuring a battery state, the apparatus comprising:
a battery;
a sensor configured to measure a current value output from the battery; and
a controller configured to calculate a current rate (C-rate) based on the current value, to determine an operational mode of the battery based on the C-rate to measure the battery state using an electrochemical model in response to the battery determined to be operating in a low rate mode, and to measure the battery state using a modified electrochemical model based on a characteristic of the battery, in response to the battery determined to be operating in a high rate mode.

11. The apparatus of claim 10, wherein the battery state comprises a state of charge (SOC) of the battery.

12. The apparatus of claim 10, wherein the controller is configured to determine that the battery is operating in the high rate mode in response to the C-rate being greater than or equal to a first preset reference value, and to determine that the battery is operating in the low rate mode in response to the C-rate being less than the first preset reference value.

13. The apparatus of claim 10, wherein the sensor is configured to acquire a voltage value of the battery, and
the controller is configured to determine that the battery is operating in the high rate mode in response to the C-rate being less than the first preset reference value and the voltage value being greater than or equal to a second preset reference value.

14. The apparatus of claim 10, wherein the controller is configured to measure the battery state using a Butler-Volmer's equation for determining an electrochemical reaction amount on an interface between an electrode and an electrolyte in response to the battery operating in the low rate mode.

15. The apparatus of claim 10, wherein the controller is configured to measure the battery state using a modified Butler-Volmer's equation based on the characteristic of the battery in response to the battery operating in the high rate mode.

16. The apparatus of claim 15, wherein the characteristic of the battery comprises the concentration of the battery.

17. The apparatus of claim 16, wherein the concentration of the battery comprises the concentration overvoltage of the battery.

18. An apparatus for measuring a battery state, the apparatus comprising:
a battery;
a sensor configured to measure a temperature of the battery; and
a controller configured to determine an operational mode of the battery, to measure the battery state using an electrochemical model in response to the battery determined to be operating in a low rate mode, and to measure the battery state using a modified electrochemical model based on a characteristic of the battery, in response to the battery determined to be operating in a high rate mode,
wherein the controller is configured to determine that the battery is operating in the high rate mode in response to the temperature being less than a preset reference value.

* * * * *